United States Patent
Homma et al.

(10) Patent No.: US 6,798,050 B1
(45) Date of Patent: Sep. 28, 2004

(54) SEMICONDUCTOR DEVICE HAVING SEMICONDUCTOR ELEMENT WITH COPPER PAD MOUNTED ON WIRING SUBSTRATE AND METHOD FOR FABRICATING THE SAME

(75) Inventors: Soichi Homma, Kawasaki (JP); Masahiro Miyata, Yokohama (JP); Hirokazu Ezawa, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/672,783

(22) Filed: Sep. 18, 2000

(30) Foreign Application Priority Data

Sep. 22, 1999 (JP) .......................................... 11-269272

(51) Int. Cl.$^7$ .............................................. H01L 23/02
(52) U.S. Cl. ...................... 257/678; 257/751; 438/594; 438/614
(58) Field of Search ................................ 257/678, 751; 438/614, 597

(56) References Cited

U.S. PATENT DOCUMENTS

| | | | | |
|---|---|---|---|---|
| 3,826,886 A | * | 7/1974 | Hara et al. ................ | 200/266 |
| 5,631,499 A | * | 5/1997 | Hosomi et al. ............ | 257/737 |
| 5,767,010 A | * | 6/1998 | Mis et al. .................. | 438/612 |
| 6,187,680 B1 | * | 2/2001 | Costrini et al. ............ | 438/611 |
| 2002/0000665 A1 | * | 1/2002 | Barr et al. ................. | 257/758 |

FOREIGN PATENT DOCUMENTS

| | | |
|---|---|---|
| JP | 6-232538 | 8/1994 |
| JP | 8-340029 | 12/1996 |
| JP | 11-233542 | 8/1999 |
| JP | 11-340265 | * 10/1999 |
| JP | 11-340265 | 12/1999 |
| KR | 1993-14855 | 7/1993 |

OTHER PUBLICATIONS

Cover sheet of Korean language Publication Nos. 96–35933, dated Oct. 28, 1996, and complete English language translation of the Korean publication cover sheet of Korean language Publication No. 93–14855, dated Jul. 31, 1993, and complete English language translation of the Korean publication.

* cited by examiner

*Primary Examiner*—Nathan J. Flynn
*Assistant Examiner*—Leonardo Andújar
(74) *Attorney, Agent, or Firm*—Finnegan, Henderson, Farabow, Garrett & Dunner, L.L.P.

(57) ABSTRACT

After a copper diffusion preventing film 4 is formed on a copper pad 1, a barrier metal including a titanium film 5, a nickel film 6, and a palladium film 7 is formed on the copper diffusion preventing film 4. The copper diffusion preventing film formed on the copper pad suppresses diffusion of copper. Even when a solder bump is formed on the copper pad, diffusion of tin in the solder and copper is suppressed. This prevents formation of an intermetallic compound between copper and tin, so no interface de-adhesion or delamination occurs and a highly reliable connection is obtained. This structure can be realized by a simple fabrication process unlike a method of forming a thick barrier metal by electroplating. In this invention, high shear strength can be ensured by connecting a solder bump, gold wire, or gold bump to a copper pad without increasing the number of fabrication steps.

6 Claims, 15 Drawing Sheets

SEMICONDUCTOR DEVICE HAVING SEMICONDUCTOR ELEMENT WITH COPPER PAD MOUNTED ON WIRING SUBSTRATE AND METHOD FOR FABRICATING THE SAME

BACKGROUND OF THE INVENTION

The present invention relates to a semiconductor device and, more particularly, to a device having a copper pad and a method of fabricating the same.

Recently, in the field of semiconductor devices, wiring layers in a semiconductor chip are formed by using copper, instead of aluminum, for reasons of preventing signal delay and the like. In this case, pads formed on the surface of a semiconductor chip are also formed using copper like copper wiring.

The following three methods are used to mount a semiconductor chip on a wiring substrate and electrically connect them.

The first method is generally called flip chip mounting by which a semiconductor chip is mounted in a vertically inverted state on a wiring substrate. Solder bumps are formed on copper pads of the semiconductor chip. The semiconductor chip is mounted on the wiring substrate via the solder bumps, and a layer of an encapsulating resin is formed between them.

Solder balls arranged in the form of an array are formed on the opposite side of the wiring substrate and connected to a printed circuit board (not shown) or the like.

A method relevant to the present invention by which a solder bump is formed on a copper pad will be described below.

FIGS. 18A to 18E show a semiconductor device fabrication method of forming a copper pad in order of steps.

As shown in FIG. 18A, a copper pad 101 is formed on the surface of a silicon substrate 103. With the surface of this copper pad 101 exposed, the silicon substrate 103 is covered with a passivation film 102.

As shown in FIG. 18B, a titanium film 104, a nickel film 105, and a palladium film 106 are stacked in this order on the entire wafer surface by sputtering or evaporation, thereby forming a barrier metal.

As shown in FIG. 18C, this barrier metal is coated with a resist, and a hole is formed to obtain a resist film 107. In this hole, solder plating is formed as a low-melting metal film 108 for forming a projecting electrode.

As shown in FIG. 18D, the resist film 107 is removed, and the Pd/Ni/Ti films 104, 105, and 106 forming the barrier metal are etched.

The whole semiconductor wafer is coated with a flux and heated in a nitrogen atmosphere to reflow the solder.

The second method is wire bonding. As shown in FIG. 19, a copper pad 302 is formed on a silicon substrate 300. With the surface of this copper pad 302 exposed, the silicon substrate 300 is covered with a passivation film 301. A gold wire 304 is connected to the copper pad 302 of this semiconductor chip. After this bonding connection, the semiconductor chip is mounted on a wiring substrate and encapsulated with a molding resin.

The third method uses TAB (Tape Automated Bonding). That is, a gold bump is formed on a pad of a semiconductor chip. The semiconductor chip is mounted on a metal cap, and a polyimide tape on which wiring is formed is connected to the gold bump.

Unfortunately, the aforementioned semiconductor devices have the following problems. As described above, a copper pad of a semiconductor chip is subjected to (1) flip chip mounting using a solder bump, (2) connection by bonding to a gold wire, or (3) TAB mounting using a gold bump. The problems of these methods will be separately described below.

(1) To form a solder bump on a copper pad, a metal stacked film is formed to suppress diffusion of tin in the solder. However, copper in the copper pad reaches the solder through this metal stacked film and forms an intermetallic compound of tin and copper. As a consequence, the shear strength lowers when the device is left to stand at high temperatures.

(2) In bonding connection of a copper pad and a gold wire, it is difficult to connect gold and copper by ultrasonic waves commonly used.

(3) To form a gold bump on a copper pad, a metal stacked film is formed to suppress diffusion of gold. However, copper in the copper pad reaches the gold through this metal stacked film. Consequently, the shear strength lowers by diffusion of the gold and copper.

To avoid the problem of item (1) above, a thick barrier metal of copper or nickel can be formed on a copper pad by electroplating. In this method, however, the number of fabrication steps increases by the plating step.

SUMMARY OF THE INVENTION

The present invention has been made in consideration of the above situation, and has as its object to provide a semiconductor device capable of ensuring high shear strength by connecting a solder bump, gold wire, or gold bump to a copper pad without increasing the number of fabrication steps, and a method of fabricating the same.

The present invention is a semiconductor device in which a semiconductor element having a copper pad is mounted on a wiring substrate, comprising a copper diffusion preventing film formed on the surface of the copper pad to prevent diffusion of copper, and a metal bump electrically connected to the copper pad with the copper diffusion preventing film interposed between them, wherein the semiconductor element is mounted on the wiring substrate via the metal bump.

The copper diffusion preventing film can contain at least one of Ni, Cr, TiN, TaN, Ta, Nb, and WN.

The present invention is a semiconductor device in which a semiconductor element having a copper pad is mounted on a wiring substrate, comprising a copper diffusion preventing film formed on the surface of the copper pad to prevent diffusion of copper, a metal film formed on the surface of the copper diffusion preventing film to improve adhesion between the copper diffusion preventing film and a metal wire, and the metal wire electrically connected to the copper pad with the copper diffusion preventing film and the metal film interposed between them, wherein the semiconductor element is mounted on the wiring substrate via the metal wire.

The copper diffusion preventing film can contain at least one of Ni, Cr, TiN, TaN, Ta, Nb, and WN, and the metal film can contain one of Au and Pd.

The metal bump can contain gold, and one of a stacked film of Ti, Ni, and Pd, a stacked film of Ti, Ni, and Au, a stacked film of TiW and Au, and a stacked film of TiW and Pd can be formed between the copper diffusion preventing film and the metal bump.

The metal bump can contain solder, and one of a stacked film of Ti and Ni, a stacked film of Ti, Ni, and Pd, a stacked film of Ti, Ni, and Au, a stacked film of Cr and Ni, a stacked film of Cr and Au, a stacked film of Cr, Ni, and Au, a stacked film of Cr, Ni, and Pd, a stacked film of Ti and Cu, a stacked film of Ti, Cu, and Au, a stacked film of Cr and Cu, and a stacked film of Cr, Cu, and Au can be formed between the copper diffusion preventing film and the metal bump.

The present invention is a method of fabricating a semiconductor device in which a semiconductor element having a copper pad is mounted on a wiring substrate, comprising the steps of forming a copper diffusion preventing film for preventing diffusion of copper on the surface of the copper pad, forming a metal bump to be electrically connected to the copper pad with the copper diffusion preventing film interposed between them, and mounting the semiconductor element on the wiring substrate via the metal bump.

The present invention is a semiconductor device fabrication method of mounting a semiconductor element having a copper pad on a wiring substrate by flip chip mounting by using a solder bump, comprising the steps of forming a copper diffusion preventing film for preventing diffusion of copper on the surface of the copper pad, forming a metal stacked film for suppressing diffusion of tin contained in a solder bump on the copper diffusion preventing film, forming the solder bump on the metal stacked film, and mounting the semiconductor element on the wiring substrate via the solder bump.

The metal stacked film can be one of a stacked film of Ti and Ni, a stacked film of Ti, Ni, and Pd, a stacked film of Ti, Ni, and Au, a stacked film of Cr and Ni, a stacked film of Cr and Au, a stacked film of Cr, Ni, and Au, a stacked film of Cr, Ni, and Pd, a stacked film of Ti and Cu, a stacked film of Ti, Cu, and Au, a stacked film of Cr and Cu, and a stacked film of Cr, Cu, and Au.

The present invention is a method of fabricating a semiconductor device in which a semiconductor element having a copper pad is mounted on a wiring substrate, comprising the steps of forming a copper diffusion preventing film for preventing diffusion of copper on the surface of the copper pad, forming a metal film for improving adhesion to a metal wire on the copper diffusion preventing film, electrically connecting the metal wire to the copper pad with the copper diffusion preventing film and the metal film interposed between them, and mounting the semiconductor element on the wiring substrate via the metal wire.

The present invention is a method of fabricating a semiconductor device in which a semiconductor element having a copper pad is mounted on a wiring substrate, comprising the steps of forming a copper diffusion preventing film for preventing diffusion of copper on the surface of the copper pad, forming a metal stacked film for preventing diffusion of gold on the copper diffusion preventing film, forming a gold bump to be electrically connected to the copper pad with the copper diffusion preventing film and the metal stacked film interposed between them, and mounting the semiconductor element on the wiring substrate via the gold bump.

In the semiconductor devices and their fabrication methods according to the present invention, a copper diffusion preventing film formed on a copper pad suppresses diffusion of copper, and this suppresses diffusion of a component in a metal bump or metal wire and copper. Therefore, no intermetallic compound of the component in the metal bump or metal wire and copper is formed, so no interfacial de-adhesion removal takes place. Accordingly, a highly reliable connection is obtained. Additionally, the fabrication process can be simplified compared to a method of forming a thick barrier metal by electroplating.

Also, the present invention is a semiconductor device in which a semiconductor element having a copper pad is mounted on a wiring substrate, comprising a copper diffusion preventing film formed on the surface of the copper pad to prevent diffusion of copper, an aluminum film formed on the surface of the copper diffusion preventing film, and a metal wire electrically connected to the copper pad with the copper diffusion preventing film and the aluminum film interposed between them, wherein the semiconductor element is mounted on the wiring substrate via the metal wire.

The device can further comprise a metal film for improving adhesion between the copper diffusion preventing film and the aluminum film.

The copper diffusion preventing film can contain at least one of Ni, Cr, TiN, TaN, Ta, Nb, and WN.

When the device further comprises the metal film, this metal film can contain at least one of Ti, Ni, Cr, TiN, TaN, Ta, Nb, and WN.

The device can further comprise a passivation film covering the copper pad or a passivation film covering the copper pad and the copper diffusion preventing film.

A method of fabricating this semiconductor device comprises the steps of forming a copper diffusion preventing film for preventing diffusion of copper on the surface of the copper pad, forming an aluminum film on the copper diffusion preventing film, electrically connecting a metal wire to the copper pad with the copper diffusion preventing film and the aluminum film interposed between them, and mounting the semiconductor element on the wiring substrate via the metal wire.

The method can further comprise the step of forming a metal film for improving adhesion between the copper diffusion preventing film and the aluminum film.

DESCRIPTION OF THE PREFERRED EMBODIMENTS

One embodiment of the present invention will be described below with reference to the accompanying drawings.

The structure of a semiconductor device according to the first embodiment of the present invention and a method of fabricating the same will be described with reference to FIGS. 1A to 1F.

Figure 1A:
FIGS. 1A to 1F are longitudinal sectional views showing the structure of a semiconductor device according to the first embodiment of the present invention and a method of fabricating the same in order of steps.

A semiconductor chip wafer (6 inches in diameter and 625 $\mu$m in thickness) on which a copper pad 1 is formed is prepared. The size of this copper pad 1 is 100 $\mu$m square. A plurality of such pads are two-dimensionally formed at a pitch of 350 $\mu$m on the entire surface of a semiconductor chip (10 mm×10 mm). The longitudinal sectional structure in this state is as shown in FIG. 1A. The copper pad 1 is formed on the surface of a silicon substrate 3. With the surface of this copper pad 1 exposed, the surface of the silicon substrate 3 is covered with a passivation film 2 having a thickness of, e.g., 1 $\mu$m.

Figure 1B:
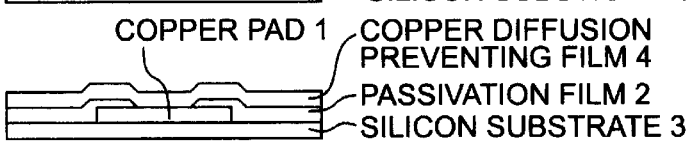

As shown in FIG. 1B, a copper diffusion preventing film 4 is formed on the entire wafer surface by, e.g., sputtering or evaporation. This copper diffusion preventing film 4 is formed to have a thickness of, e.g., 1 $\mu$m by using Ni, Cr, TiN, TaN, Ta, Nb, or WN.

Figure 1C:
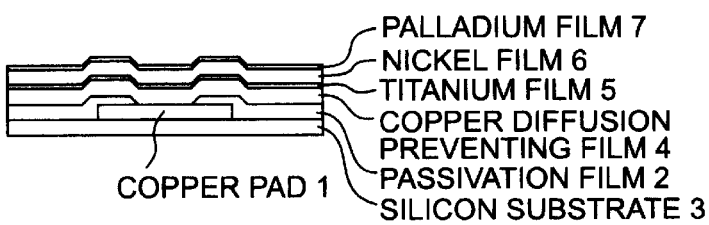

As shown in FIG. 1C, a 1,000-Å thick titanium film 5, a 3,000-Å thick nickel film 6, and a 500-Å thick palladium film 7 are formed in this order on the entire wafer surface by using, e.g., a sputtering system or an electron beam evaporation system, thereby forming a barrier metal.

Figure 1D:
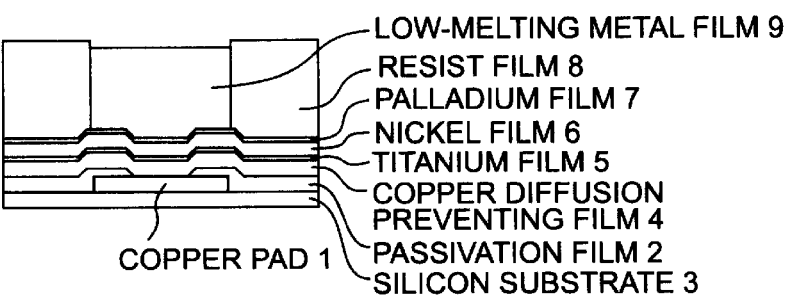

As shown in FIG. 1D, this barrier metal is coated with a resist film 8 having a thickness of about 50 $\mu$m. A square hole of 100 $\mu$m side is formed in a portion of this resist film 8, which corresponds to a prospective projecting electrode portion on the copper pad 1. This hole is plated with 50-$\mu$m thick solder as a low-melting metal film 9 for forming a projecting electrode.

When eutectic Sn/Pb solder, for example, is used in this solder plating, the semiconductor wafer having a resist pattern is dipped into a solution containing 30 g/l of tin, 20 g/l of lead, 100 g/l of alkanesulfonic acid, and an additive consisting primarily of a surfactant. At a bath temperature of 20° C., plating is performed under moderate stirring at a current density of 1 A/dm$^2$ by using the barrier metal as a cathode and an Sn/Pb plate as an anode.

Figure 1E:
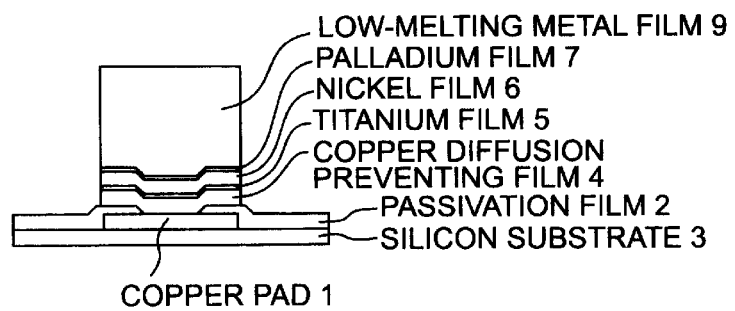
Figure 1F:
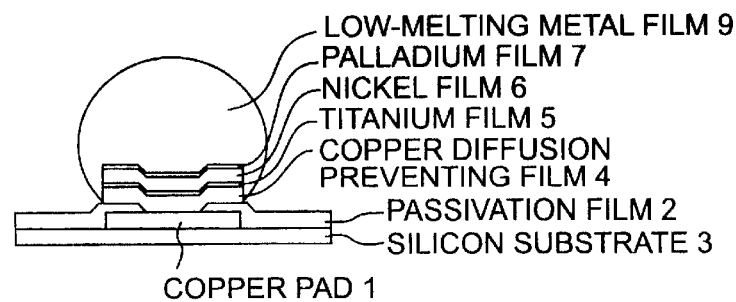
Figure 2A:
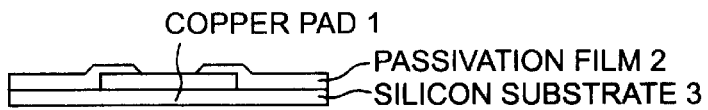
FIGS. 2A to 2E are longitudinal sectional views showing the structure of a modification of the semiconductor device according to the first embodiment and a method of fabricating the same in order of steps.
Figure 2B:
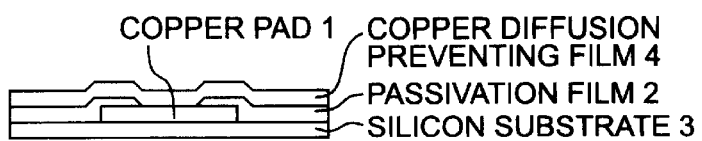
Figure 2C:
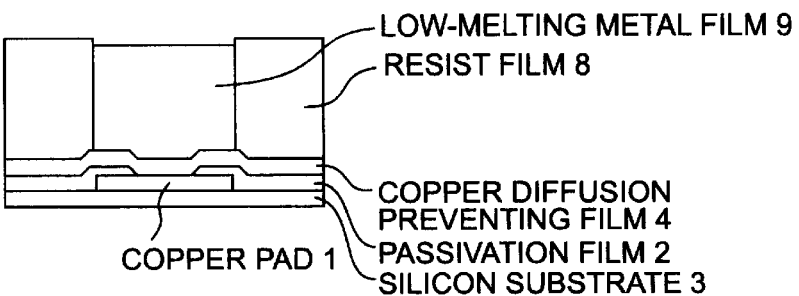
Figure 2D:
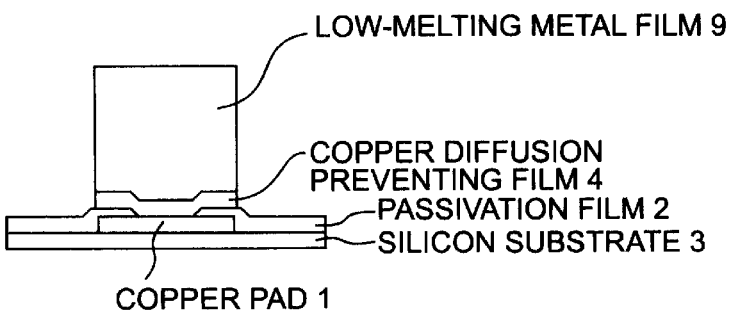
Figure 2E:
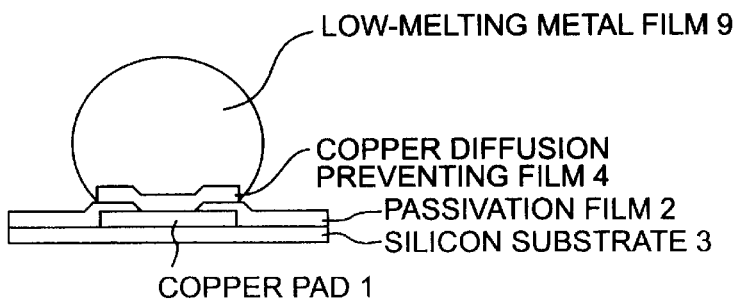

As shown in FIG. 1E, the resist film 8 is removed by using a solvent such as acetone or a release agent, and the Pd/Ni/Ti film as the barrier metal is etched.

That is, an aqua regia-based etchant is used to etch the palladium film 7 and the nickel film 6. An ethylenediamine-tetraacetic acid-based etchant can be used to etch the titanium film 5.

Subsequently, the copper diffusion preventing film 4 is also patterned by etching.

Finally, the whole semiconductor wafer is coated with a flux and heated in a nitrogen atmosphere at 220° C. for 30 sec to reflow the low-melting metal film 9.

After that, electrical tests are conducted, the wafer is diced into semiconductor chips, and flip chip mounting is performed. That is, a semiconductor chip and a mounting substrate are temporarily fixed and passed through a nitrogen reflow furnace to melt the low-melting metal film 9 forming the bump. Consequently, the semiconductor chip is mounted as it is electrically connected to the mounting substrate, thereby obtaining a semiconductor device.

A connection pad on the wiring substrate is one of Cu, Ni, Au, and Pd or a stacked film or mixed film of these metals. Alternatively, one of low-melting metals such as Sn, Pb, Ag, Bi, Zn, In, Sb, Cu, Bi, and Ge or a mixed film of these metals is formed on a metal film.

A semiconductor device can also be formed by filling and later curing a silicone resin between the semiconductor chip, which is mounted on the mounting substrate, and the mounting substrate. An epoxy resin or an acrylic resin can also be used as the resin.

After the semiconductor device was fabricated in accordance with the abovementioned steps, a temperature cycle test was conducted to examine its reliability.

A square chip of 10 mm side on which 900 bumps were formed was used as a semiconductor ship, and this chip was mounted on a resin substrate to form a sample. In the temperature cycle test, the temperature was maintained at –65° C. for 30 min, 25° C. for 5 min, and 150° C. for 30 min in one cycle.

Even after 3,000 such cycles, no breaking was found in portions where solder bumps were connected to the copper pads 1.

Figure 11:
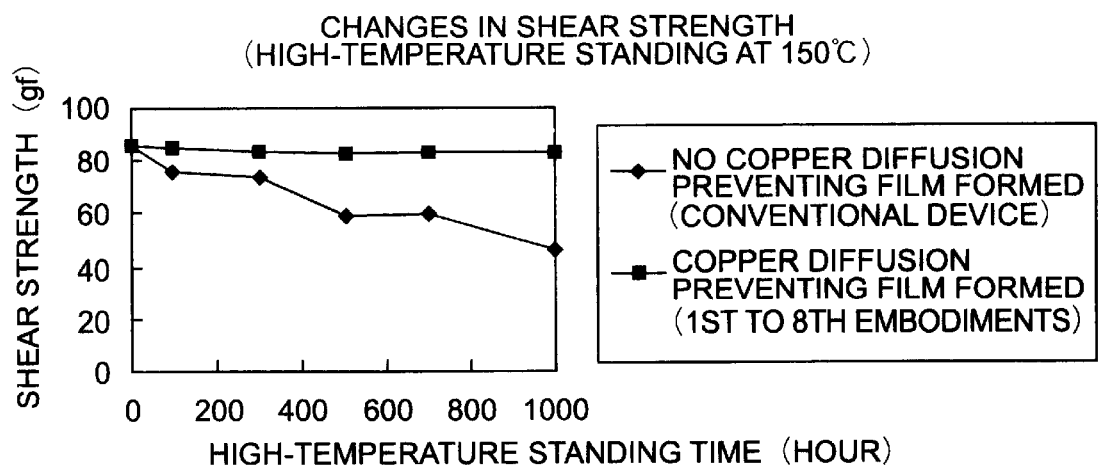
FIG. 11 is a graph comparing the shear strength of a solder bump connected to a copper pad of the semiconductor devices according to the above embodiments with that of a semiconductor device relevant to the present invention.

Also, as shown in FIG. 11, the shear strength of the metal bump had no problem against a force of 50 gf even after the sample was left to stand at a high temperature of 150° C. for 1,000 hr. That is, neither bump removal nor strength degradation occurred, and no short circuit between bumps took place.

Furthermore, the bump shear strength did not lower even after the semiconductor wafer was left to stand at 150° C. for 5,000 hr.

In this sample, Sn/Pb solder was used as the solder bump. However, it was also possible to use a solder bump formed by any of metals such as Sn, Pb, Ag, Bi, Zn, In, Sb, Cu, Bi, and Ge or by a mixed film of these metals.

In the above embodiment, a titanium/nickel/palladium film is used as a barrier metal. However, it is also possible to use any of a titanium/nickel stacked film, titanium/nickel/gold stacked film, chromium/nickel stacked film, chromium/gold stacked film, chromium/nickel/gold stacked film, chromium/nickel/palladium stacked film, titanium/copper stacked film, titanium/copper/gold stacked film, chromium/copper stacked film, and chromium/copper/gold stacked film.

In this embodiment as described above, a copper diffusion preventing film formed on a copper pad suppresses diffusion of copper, and this prevents diffusion of tin in a solder bump and copper. Therefore, no intermetallic compound of copper and tin is formed, so no interface removal occurs. Consequently, a highly reliable connection is obtained. Also, the fabrication process can be simplified compared to a method of forming a thick barrier metal by electroplating.

In this embodiment, the titanium film 5, the nickel film 6, the palladium film 7 are formed on the copper diffusion preventing film 4, and the low-melting metal film 9 is formed on top of these films. However, as shown in FIGS. 2A to 2E, a low-melting metal film 9 can also be formed directly on a copper diffusion preventing film 4.

The structure of a semiconductor device according to the second embodiment of the present invention and a method of fabricating the same will be described below.

Figure 3A:
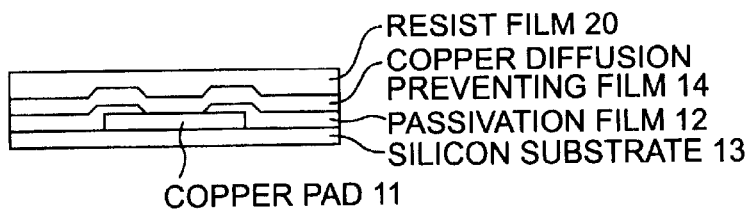
FIGS. 3A to 3D are longitudinal sectional views showing the structure of a semiconductor device according to the second embodiment of the present invention and a method of fabricating the same in order of steps.

As shown in FIG. 3A, similar to the steps shown in FIGS. 1A and 1B in the first embodiment described above, a copper pad 11, a passivation film 12, and a copper diffusion preventing film 14 are formed on a silicon substrate 13. In addition, a resist film 20 is formed on the entire surface of the silicon substrate 13.

Figure 3B:
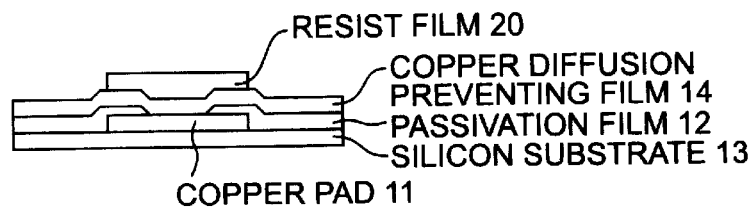

As shown in FIG. 3B, the resist film 20 developed such that its portion corresponding to a hole in the passivation film 12 on the copper pad 11, and a resist film 20 portion larger than this hole remains. The size of this residual resist film 20 is, e.g., 70 μm square.

Figure 3C:
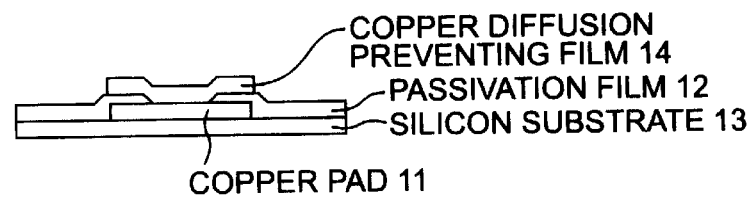
Figure 3D:
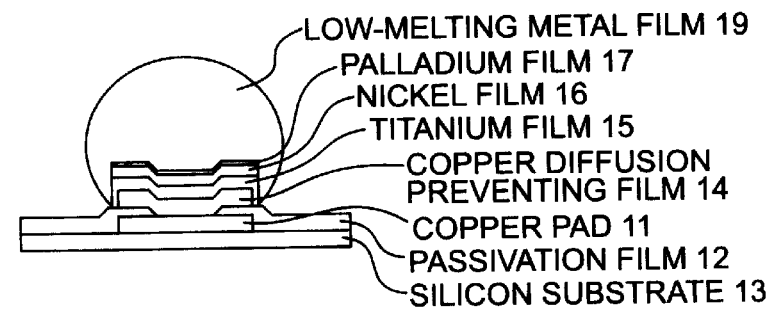

As shown in FIG. 3C, the resist film 20 is used as a mask to etch the copper diffusion preventing film 14, thereby patterning the film 14 such that it remains in a portion corresponding to the hole. After that, as in the above first embodiment, a titanium film 15, a nickel film 16, a palladium film 17, and a low-melting metal film 19 are formed as shown in FIG. 3D.

In this embodiment, the copper diffusion preventing film 14 formed on the copper pad 11 is so patterned as to correspond to the hole before the barrier metal layer is formed. Therefore, only the barrier metal needs to be etched, so the fabrication process is simple.

Finally, as in the first embodiment, the semiconductor wafer is coated with a flux and heated in a nitrogen atmosphere at 220° C. for 30 sec to reflow the low-melting metal film 19. After that, electrical tests are conducted, dicing is performed to divide the wafer into chips, and flip chip mounting is performed.

In this embodiment, effects similar to the aforementioned first embodiment can be obtained. In the first embodiment, the low-melting metal film and the barrier metal are simultaneously etched. Therefore, damage to the low-melting metal film may increase depending on the type of etchant. In this second embodiment, however, the copper diffusion preventing film is patterned before the barrier metal is formed on the entire surface. This can reduce etching damage to the low-melting metal film.

The structure of a semiconductor device according to the third embodiment of the present invention and a method of fabricating the same will be described below with reference to FIGS. 4A and 4B.

As in the first and second embodiments described above, a semiconductor wafer (6 inches in diameter and 625 μm in thickness) having a copper pad 31 is prepared.

Figure 4A:
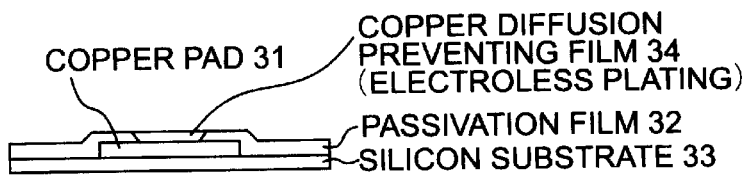
FIGS. 4A and 4B are longitudinal sectional views showing the structure of a semiconductor device according to the third embodiment of the present invention and a method of fabricating the same in order of steps.
Figure 4B:
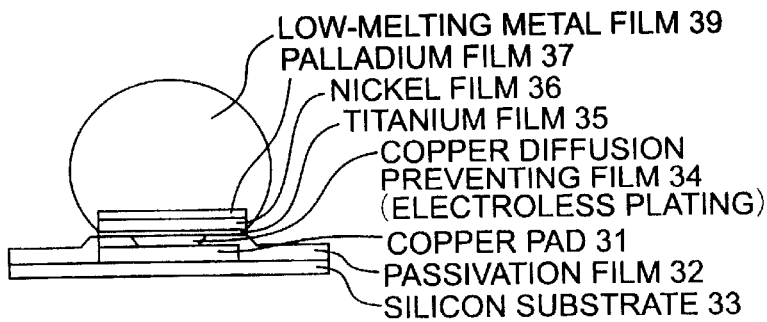

As shown in FIG. 4A, a copper diffusion preventing film 34 is formed on the copper pad 31 by electroless plating. As this copper diffusion preventing film 34, Ni, Cr, TiN, TaN, Ta, Nb, or WN is used. Electroless plating can selectively form the copper diffusion preventing film 34 only on the copper pad 31. When the copper diffusion preventing film 34 is to be formed by selecting Ni, Ni—B or Ni—P can also be used. The subsequent steps are similar to the abovementioned first and second embodiments. Consequently, as shown in FIG. 4B, a titanium film 35, a nickel film 36, a palladium film 37, and a low-melting metal film 39 are formed.

In this third embodiment, the copper diffusion preventing film 34 is selectively formed on the copper pad 31 by electroless plating. Hence, the copper diffusion preventing film formed on the copper pad need not be etched by patterning unlike in the first and second embodiments. This simplifies the fabrication process.

Finally, the semiconductor wafer is coated with a flux and heated in a nitrogen atmosphere at 220° C. for 30 sec to reflow the solder metal. After that, electrical tests are conducted, the wafer is diced into semiconductor chips, and flip chip mounting is performed.

In this embodiment, the low-melting metal film is formed on the copper pad by electroless plating. This allows easy formation of the metal film. Electroless plating can smoothen roughness on the surface of the copper pad to thereby improve the adhesion to the barrier metal, and can also improve the barrier characteristics.

The structure of a semiconductor device according to the fourth embodiment of the present invention and a method of fabricating the same will be described below.

Figure 5A:
FIGS. 5A to 5F are longitudinal sectional views showing the structure of a semiconductor device according to the fourth embodiment of the present invention and a method of fabricating the same in order of steps.

As shown in FIG. 5A, a semiconductor wafer (6 inches in diameter and 625 μm in thickness) having a copper pad 41 is prepared. In this stage, no passivation film is formed. The size of the copper pad 41 is 100 μm square. A plurality of such copper pads are two-dimensionally formed at a pitch of 350 μm on the entire surface of a semiconductor chip (10 mm×10 mm).

Figure 5B:

As shown in FIG. 5B, a copper diffusion preventing film 44 is formed on the entire surface of the semiconductor wafer. As this copper diffusion preventing film 44, Ni, Cr, TiN, TaN, Ta, Nb, or WN is used.

Figure 5C:
Figure 5D:

As shown in FIG. 5C, a resist film is formed on the whole semiconductor wafer surface, and exposure and development are performed such that the resist film 40 remains on the copper pad 41 as shown in FIG. 5D.

In FIG. 5D, the copper diffusion preventing film 44 is patterned by etching so as to remain only on the copper pad 41.

Figure 5E:
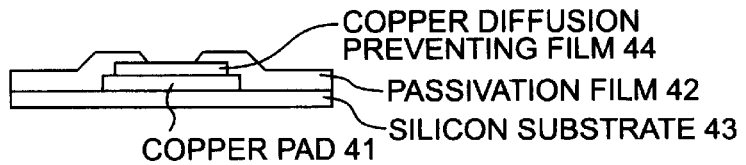

As shown in FIG. 5E, a passivation film 42 is formed. As this passivation film 42, an inorganic film such as SiN or $SiO_2$, an organic film such as polyimide, BCB, or epoxy resin, or a composite film of these films is used.

The above steps are similar to the first embodiment. In this embodiment, the copper diffusion preventing film 44 is formed first on the copper pad 41, so only a barrier metal needs to be etched.

Figure 5F:
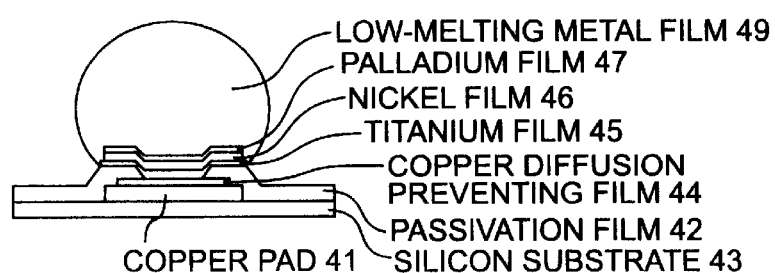

Finally, the semiconductor wafer is coated with a flux and heated in a nitrogen atmosphere at 220° C. for 30 sec to reflow a low-melting metal film 49 as shown in FIG. 5F.

After that, electrical tests are conducted, the wafer is diced into semiconductor chips, and flip chip mounting is performed.

The structure of a semiconductor device according to the fifth embodiment of the present invention and a method of fabricating the same will be described below with reference to FIGS. 6A to 6C.

Figure 6A:
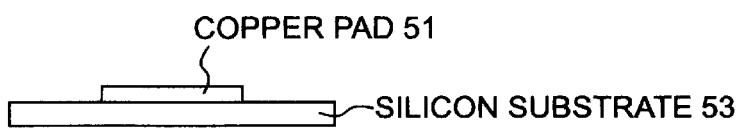
FIGS. 6A to 6C are longitudinal sectional views showing the structure of a semiconductor device according to the fifth embodiment of the present invention and a method of fabricating the same in order of steps.

As shown in FIG. 6A, a semiconductor wafer (6 inches in diameter and 625 µm in thickness) having a copper pad 51 is prepared. In this stage, no passivation film is formed. The size of the copper pad 51 is 100 µm square. A plurality of such copper pads are two-dimensionally formed at a pitch of 350 µm on the entire surface of a semiconductor chip (10 mm×10 mm).

Figure 6B:
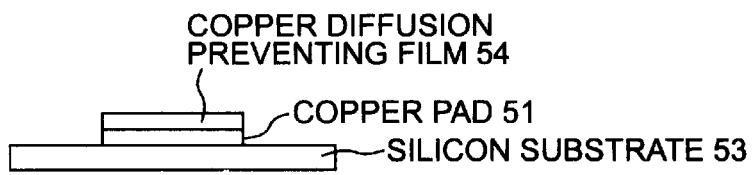

As shown in FIG. 6B, the copper pad 51 and a copper wiring portion are electroless-plated to selectively form a copper diffusion preventing film 54. As this copper diffusion preventing film 54, Ni, Cr, TiN, TaN, Ta, Nb, or WN is used. Instead of Ni, Ni—B or Ni—P can also be used. As in the fourth embodiment described above, the copper diffusion preventing film 54 is selectively formed on the copper pad 51. Hence, the subsequent steps are identical with FIGS. 5E and 5F in the fourth embodiment.

Figure 6C:
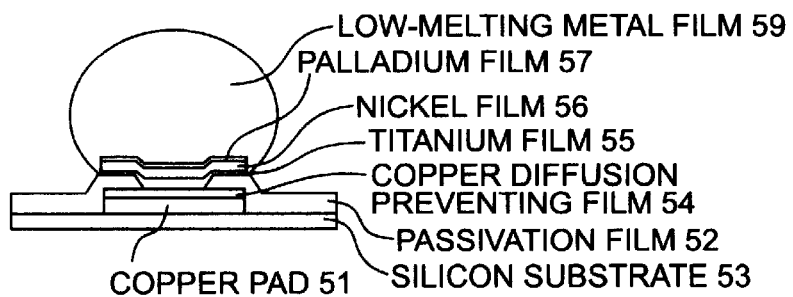

Finally, the semiconductor wafer is coated with a flux and heated in a nitrogen atmosphere at 220° C. for 30 sec to reflow a low-melting metal film 59, as shown in FIG. 6C.

After that, electrical tests are conducted, dicing is performed to divide the wafer into chips, and flip chip mounting is performed.

In this embodiment, the low-melting metal film is formed using electroless plating, so the fabrication process can be simplified. Also, the use of this electroless plating can smoothen roughness on the surface of the copper pad to thereby improve the adhesion to the barrier metal, and can also improve the barrier characteristics.

The sixth embodiment of the present invention will be described below with reference to FIGS. 7A to 7D.

In the first to fifth embodiments described above, printing is used to form solder bumps. In this embodiment, however, solder paste is buried in a hole by using a squeegee.

Figure 7A:
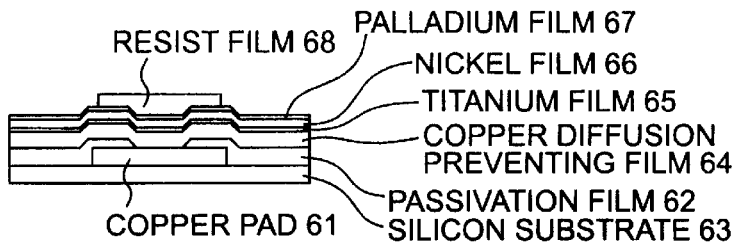
FIGS. 7A to 7D are longitudinal sectional views showing the structure of a semiconductor device according to the sixth embodiment of the present invention and a method of fabricating the same in order of steps.
Figure 7B:
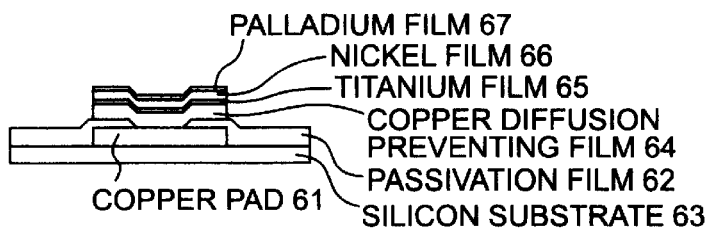

As shown in FIG. 7A, as in the first embodiment described previously, a copper diffusion preventing film 64 is formed on a copper pad 61. After that, a titanium film 65, a nickel film 66, and a palladium film 67 are formed as a barrier metal, and a resist film 68 is also formed. This resist film 68 has a square pattern of, e.g., 100 µm side.

The resist film 68 is used as a mask to pattern the titanium film 65, the nickel film 66, and the palladium film 67 by etching. The copper diffusion preventing film 64 is also patterned.

Figure 7C:
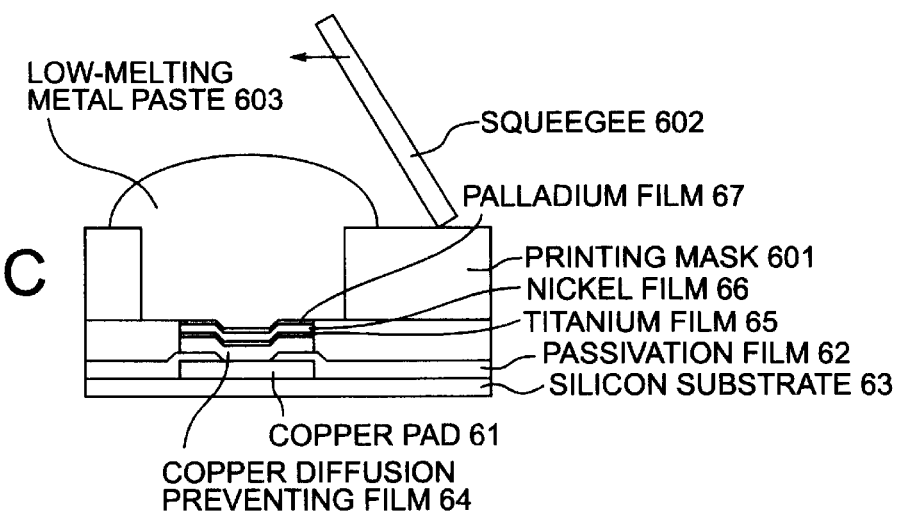

As shown in FIG. 7C, a 60-µm thick printing mask 601 which is, e.g., 160 µm square is aligned on the semiconductor wafer. This printing mask 601 has a printing mask hole as shown. Solder paste is buried as low-melting metal paste 603 in the printing mask hole by moving a squeegee 602 in the direction of an arrow.

Figure 7D:
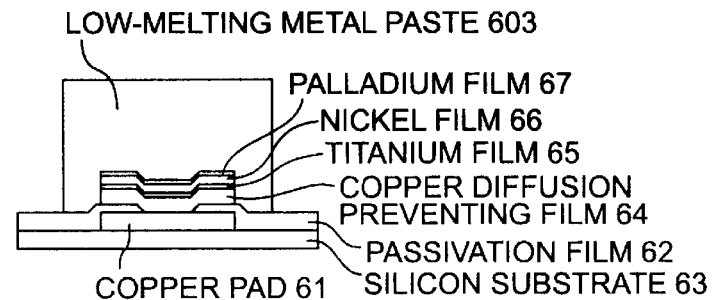

As shown in FIG. 7D, the printing mask 601 is pulled up toward the upper portion of the drawing, or the semiconductor wafer is pulled down toward the lower portion, to leave the solder paste behind in the barrier metal portion.

After that, the semiconductor wafer is heated in a nitrogen atmosphere at 220° C. for 30 sec to reflow the solder paste, and a flux is washed away. After that, electrical tests are conducted, the wafer is diced into chips, and flip chip mounting is performed.

In this embodiment, an Sn—Pb solder bump is used as low-melting metal paste. However, high reliability can also be obtained by using a metal mixture of, e.g., Sn, Pb, Ag, Bi, Zn, In, Sb, Cu, Bi, and Ge. Note that although a solder bump can be formed by printing or by burying it in a mask hole by using a squeegee, it can also be formed by placing a solder ball or coating the barrier metal with molten solder.

In the sixth embodiment as described above, a low-melting metal film is formed by printing. This can make the fabrication process simpler than when the film is formed by plating.

The structure of a semiconductor device according to the seventh embodiment of the present invention and a method of fabricating the same will be described below with reference to FIGS. 8A to 8E. This embodiment uses a mounting method which bonds a metal wire.

Figure 8A:
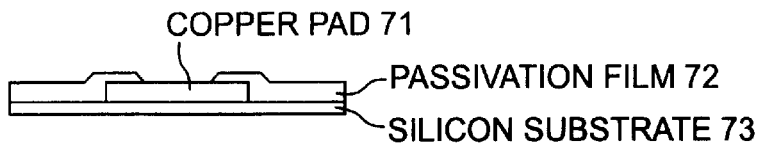
FIGS. 8A to 8E are longitudinal sectional views showing the structure of a semiconductor device according to the seventh embodiment of the present invention and a method of fabricating the same in order of steps.

As shown in FIG. 8A, a semiconductor wafer (6 inches in diameter and 625 µm in thickness) having a copper pad 71 is used.

The size of this copper pad 71 is 100 µm square. A plurality of such copper pads are arranged at a pitch of 200 µm in a peripheral region of each semiconductor chip (10 mm×10 mm) on the wafer.

Figure 8B:
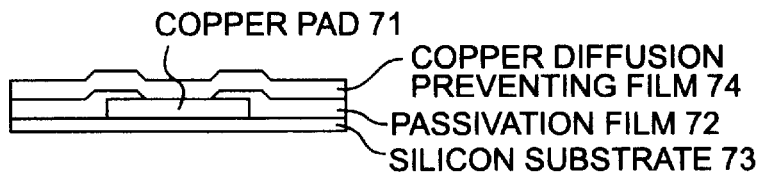

As shown in FIG. 8B, a copper diffusion preventing film 74 is formed on the upper surface of the copper pad 71 by sputtering or evaporation. As this copper diffusion preventing film 74, Ni, Cr, TiN, TaN, Ta, Nb, or WN is used.

Figure 8C:
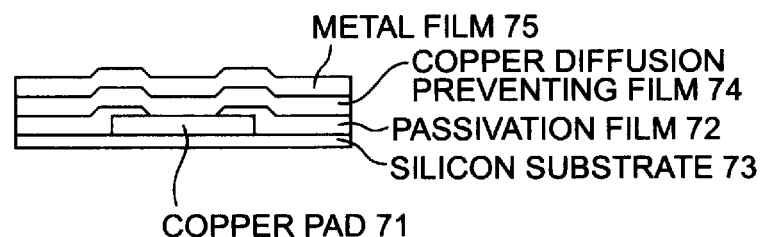

As shown in FIG. 8C, a gold film 75 is formed on the entire semiconductor wafer surface by using a sputtering system or electron beam evaporation. A palladium film can also be formed instead of the gold film. Subsequently,the gold film 75 is coated with a resist (not shown), and this resist is exposed and developed to form a resist film 100 µm square.

Figure 8D:
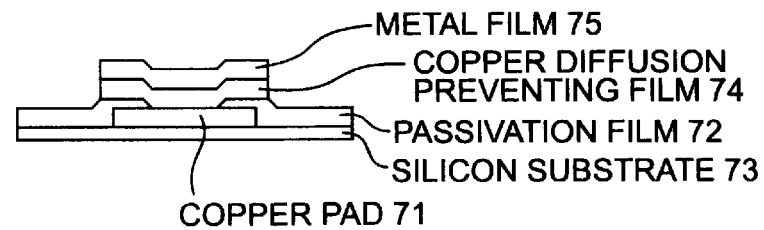
Figure 8E:
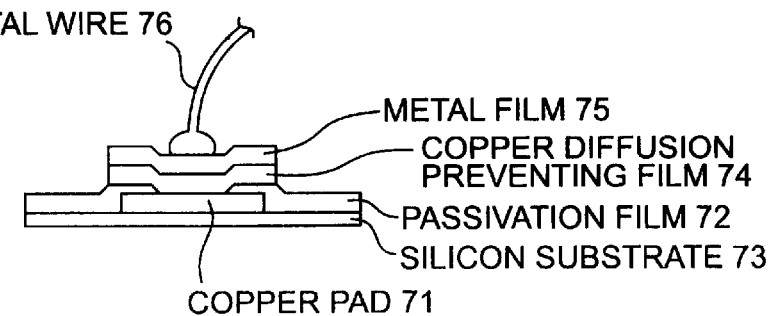

This resist film is used as a mask to etch the gold film 75 and the copper diffusion preventing film 74. When the resist film is removed by a release agent, a shape shown in FIG. 8D is obtained. After that, electrical tests are conducted, and the wafer is diced into chips. Each chip is placed on a mounting substrate and, as shown in FIG. 8E, mounted as it is electrically connected to the mounting substrate by bonding a gold-containing metal wire 76 onto the gold film 75.

A semiconductor device was fabricated in accordance with the above steps and subjected to a temperature cycle test to examine its reliability. In this temperature cycle test, one cycle was −65° C. (30 min)→25° C. (5 min)→150° C. (30 min). Even after 3,000 such cycles, the tensile strength of the bonding wire did not lower, and no breaking was found. Also, no lowering of the ball shear strength in the wire connected portion was found.

In the seventh embodiment as described above, a copper diffusion preventing film formed on a copper pad suppresses diffusion of copper, and this suppresses diffusion of copper between a metal wire and the copper. Accordingly, the connection strength between the metal wire and the copper pad and the reliability improve.

Figure 9A:
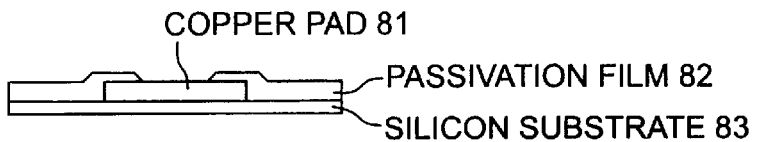
FIGS. 9A to 9E are longitudinal sectional views showing the structure of a semiconductor device according to the eighth embodiment of the present invention and a method of fabricating the same in order of steps.

The structure of a semiconductor device according to the eighth embodiment of the present invention and a method of fabricating the same will be described below. As shown in FIG. 9A, a semiconductor wafer (6 inches in diameter and 625 μm thick) having a copper pad 81 is used. The size of this copper pad 81 is 50 μm square. A plurality of such copper pads are formed at a pitch of 60 μm on the periphery of each semiconductor chip (10 mm×10 mm) on the semiconductor wafer.

Figure 9B:
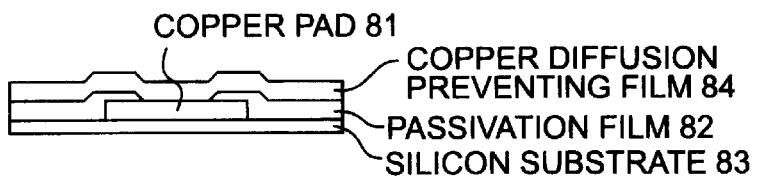

As shown in FIG. 9B, a copper diffusion preventing film 84 is formed on the upper surface of the copper pad 81 by sputtering or evaporation. As this copper diffusion preventing film, Ni, Cr, TiN, TaN, Ta, Nb, or WN is used.

Figure 9C:
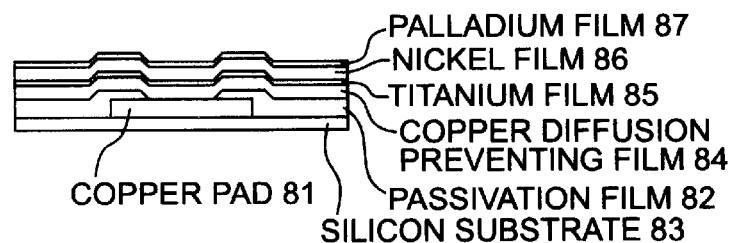

As shown in FIG. 9C, a titanium film 85, a nickel film 86, and a palladium film 87 are formed on the entire semiconductor wafer surface by using, e.g., a sputtering system or electron beam evaporation.

Instead of forming the titanium/nickel/palladium film as a barrier metal, it is also possible to use any of a titanium/nickel/gold stacked film, titanium/tungsten/gold stacked film, and titanium/tungsten/palladium stacked film as another stacked film.

Figure 9D:
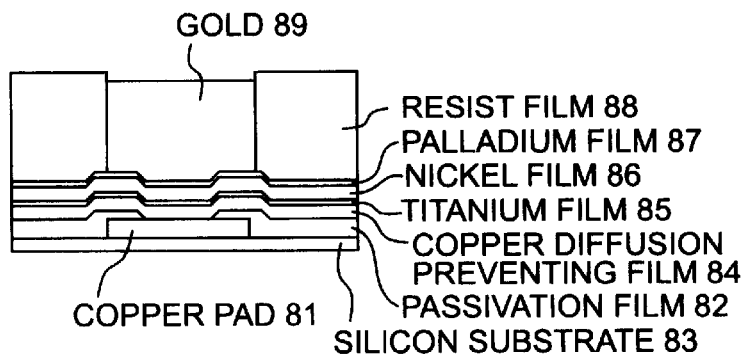

As shown in FIG. 9D, the palladium film 87 is coated with a 20-μm thick resist, and this resist is exposed and developed to form a hole 50 μm square, thereby obtaining a resist film 88. This hole is plated with a 16-μm thick gold film 89.

Figure 9E:
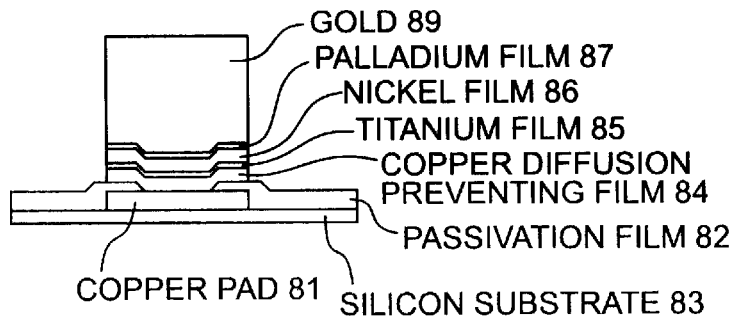
Figure 10A:
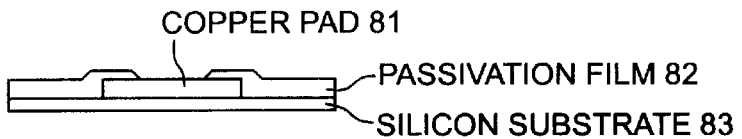
FIGS. 10A to 10D are longitudinal sectional views showing the structure of a modification of the semiconductor device according to the eighth embodiment and a method of fabricating the same in order of steps.
Figure 10B:
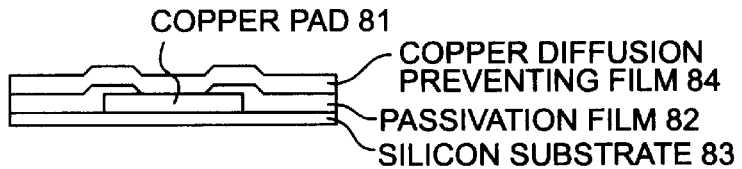
Figure 10C:
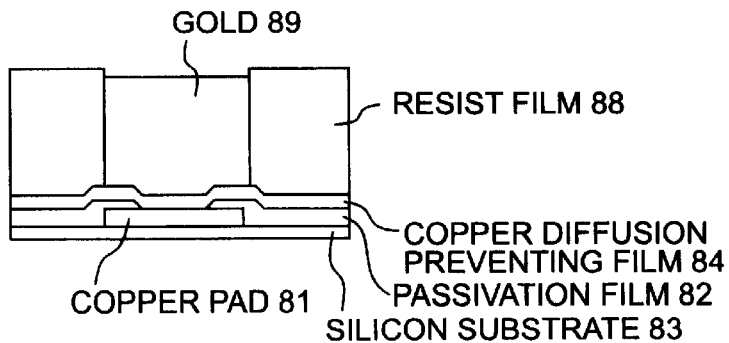
Figure 10D:
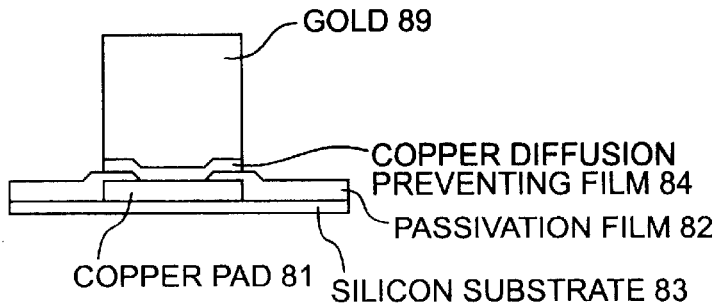

As shown in FIG. 9E, the resist film 88 is removed by using a solvent such as acetone or a release agent, and the palladium film 87, nickel film 86, and titanium film 85 forming the barrier metal are etched. The etching of the palladium film 87 and the nickel film 86 is done by using an aqua regia-based etchant.

The titanium film 85 can be etched using an ethylenediaminetetraacetic acid-based etchant. Furthermore, the copper diffusion preventing film 84 is etched. After that, electrical tests are conducted, the wafer is diced into chips, and each chip is mounted on a tape substrate by TAB by using gold bumps.

A semiconductor device was fabricated in accordance with the above steps and subjected to a temperature cycle test to examine its reliability. In this temperature cycle test, one cycle was −65° C. (30 min)→25° C. (5 min)→150° C. (30 min). Even after 3,000 such cycles, the connection strength of the gold bump did not lower, and no breaking was found.

In the eighth embodiment described above, a copper diffusion preventing film formed on a copper pad suppresses diffusion of copper, and this suppresses diffusion of the copper to a gold bump. Accordingly, no interface removal occurs, so a highly reliable connection is obtained.

In the above eighth embodiment, the gold bump 89 is formed after the titanium film 85, the nickel film 86, and the palladium film 87 are formed on the copper diffusion preventing film 84.

As shown in FIGS. 10A to 10D, however, a gold bump 89 can also be formed directly on a copper diffusion preventing film 84 without forming the titanium film 85, the nickel film 86, and the palladium film 87.

The ninth embodiment of the present invention will be described below with reference to FIGS. 15A to 15E.

Figure 15A:
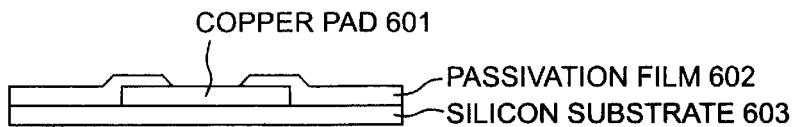
FIGS. 15A to 15E are longitudinal sectional views showing the structure of a semiconductor device according to the ninth embodiment of the present invention and a method of fabricating the same in order of steps.

As shown in FIG. 15A, a silicon substrate 603 (a semiconductor chip wafer (6 inches in diameter and 625 μm in thickness) having a copper pad 601 is prepared. The size of this copper pad 601 is, e.g., 100 μm square. A plurality of such copper pads are formed at a pitch of 200 μm on the periphery of a semiconductor chip (10 mm×10 mm). Also, with the surface of this copper pad 601 exposed, the surface of the silicon substrate 603 is covered with a passivation film 602 having a thickness of, e.g., 1 μm.

Figure 15B:
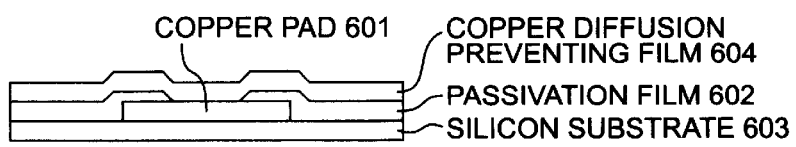

As shown in FIG. 15B, a copper diffusion preventing film 604 is formed on the entire surface of the silicon substrate 603 by, e.g., sputtering or evaporation. This copper diffusion preventing film 604 is formed to have a thickness of, e.g., 1 μm by using Ni, Cr, TiN, TaN, Ta, Nb, or WN.

Figure 15C:
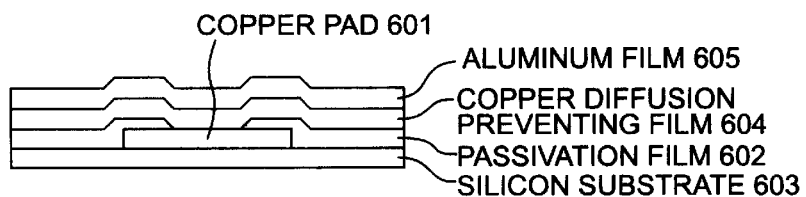

As shown in FIG. 15C, an aluminum (Al) film 605 is formed on the entire surface of the silicon substrate 603 by using, e.g., a sputtering system or an electron beam evaporation system.

Figure 15D:
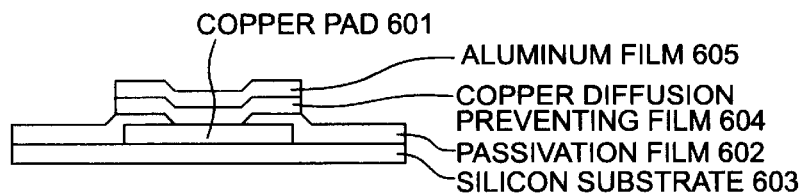

The whole surface is coated with a resist, and this resist is exposed and developed to form a resist film 100 μm square in a portion corresponding to the copper pad 601. This resist film is used as a mask to etch the copper diffusion preventing film 604 and the aluminum film 605 as shown in FIG. 15D, and the resist film is removed to obtain a semiconductor device.

Figure 15E:
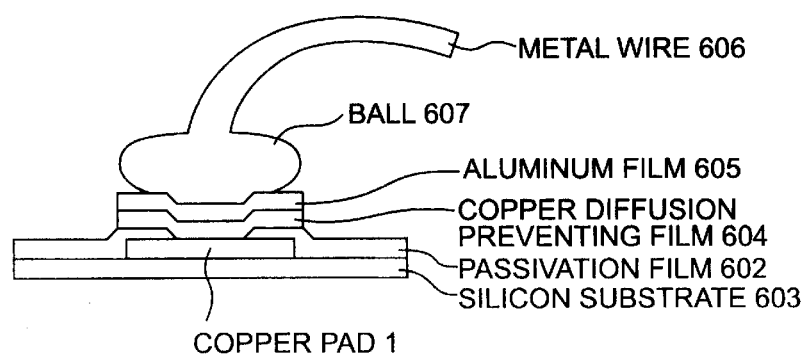

After that, electrical tests are conducted, and the wafer is diced into a plurality of chips. As shown in FIG. 15E, a metal wire 606 is bonded on the aluminum film 605 and then bonded to an electrode on a wiring substrate (not shown), thereby mounting each chip.

A semiconductor device obtained by the above steps was subjected to a temperature cycle test to examine its reliability. In this temperature cycle test, one cycle was −65° C. (30 min)→25° C. (5 min)→150° C. (30 min).

Even after 3,000 such cycles, the tensile strength of wire bonding did not lower, and no breaking was found. Also, the shear strength of a ball 607 for connecting the metal wire 606 and the aluminum film 605 did not lower.

Figure 16:
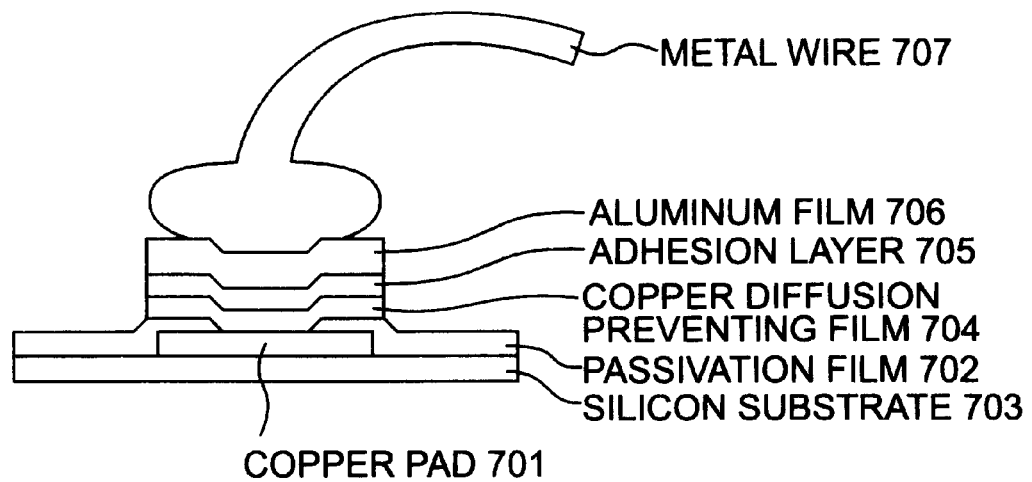
FIG. 16 is a longitudinal sectional view showing one modification of the ninth embodiment.

In this embodiment, the metal wire 606 is connected directly to the aluminum film 605. However, as shown in FIG. 16, an adhesion layer 705 can also be formed between an aluminum film 706 and a copper diffusion preventing film 704. As this adhesion layer, it is possible to use Ti, Ni, Cr, TiN, TaN, Ta, Nb, or WN, or a stacked film of these metals. In this modification, a copper pad 701, a passivation film 702, the copper diffusion preventing film 704, the aluminum film 706, and a metal wire 707 are formed in the same manner as in the ninth embodiment, so a detailed description thereof will be omitted.

Figure 17:
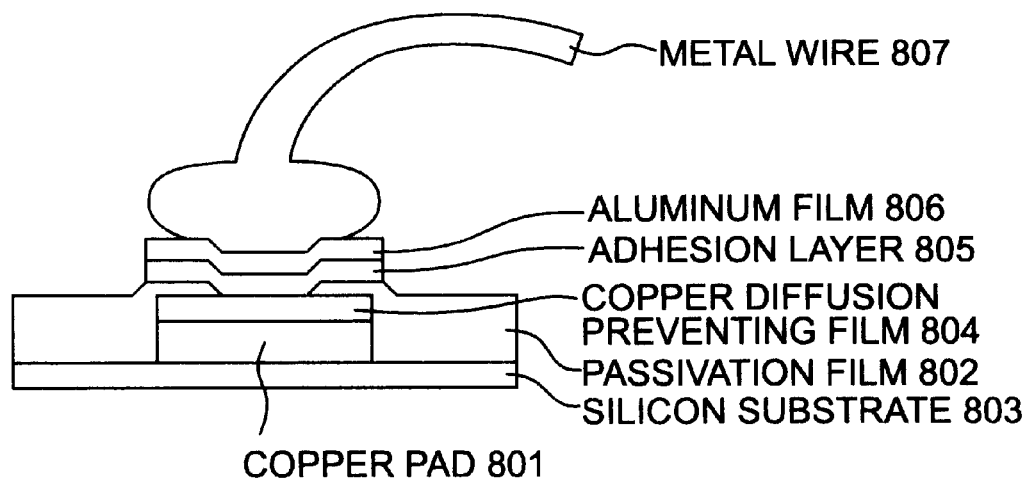
FIG. 17 is a longitudinal sectional view showing another modification of the ninth embodiment.
Figure 18A:
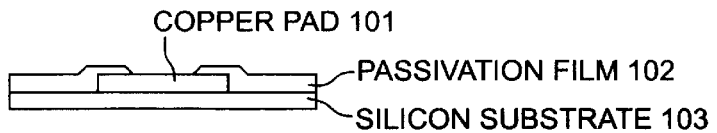
FIGS. 18A to 18E are longitudinal sectional views showing the structure of a semiconductor device relevant to the present invention and a method of fabricating the same in order of steps.
Figure 18B:
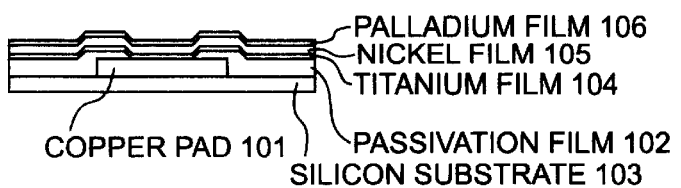
Figure 18C:
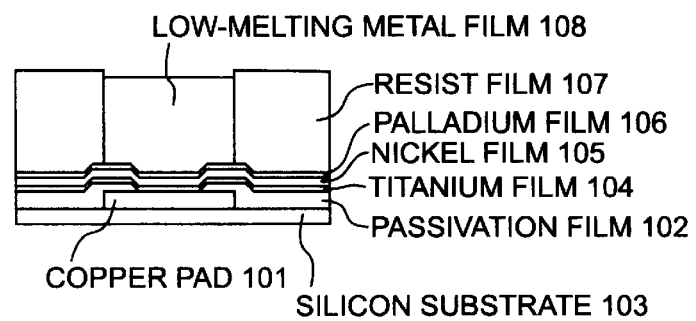
Figure 18D:
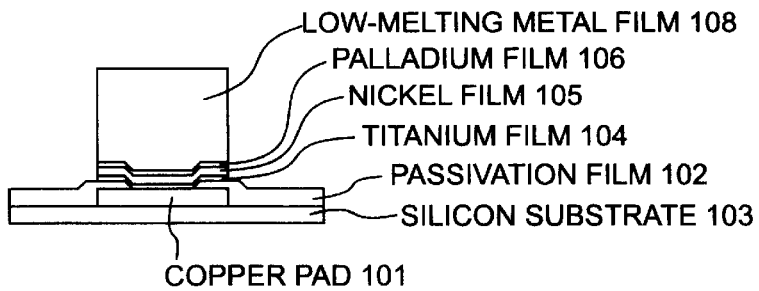
Figure 18E:
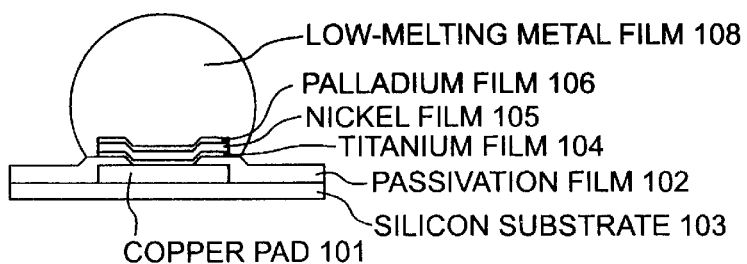
Figure 19:
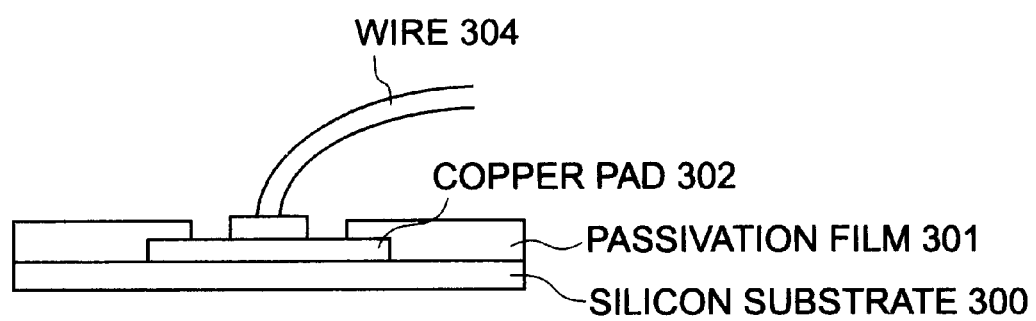
FIG. 19 is a longitudinal sectional view showing a structure when a gold wire is connected by bonding to a semiconductor chip having a copper pad.

Also, as shown in FIG. 17, a passivation film 802 can be formed to cover not only a copper pad 801 but a copper diffusion preventing film 804.

Methods of mounting a semiconductor chip on a wiring substrate by using any of the above embodiments will be described below with reference to the accompanying drawings.

Figure 12:
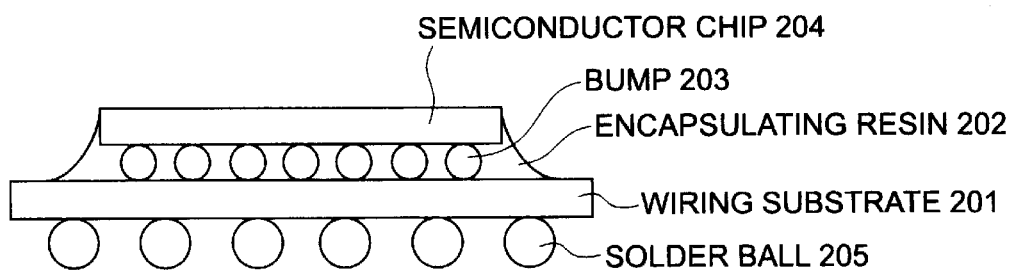
FIG. 12 is a longitudinal sectional view showing a structure when the semiconductor device of any of the above embodiments is flip-chip-mounted.

First, in a method called flip chip mounting, as shown in FIG. 12, a semiconductor chip 204 is vertically inverted and placed on a wiring substrate 201. Bumps 203 made of, e.g., solder or gold are formed on copper pads of this semiconductor chip 204. The semiconductor chip 204 having this structure is placed on the wiring substrate 201 via the bumps 203, and an encapsulating resin 202 is formed between the semiconductor chip 204 and the wiring substrate 201. Solder balls 205 arranged in the form of an array are formed on the opposite surface of the wiring substrate 201 and connected to a printed circuit board (not shown).

Figure 13:
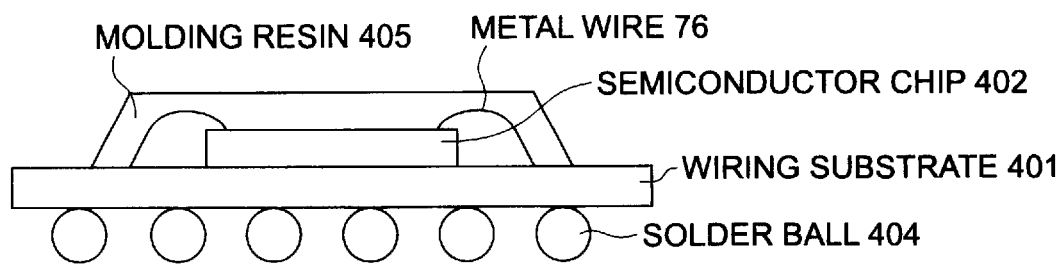
FIG. 13 is a longitudinal sectional view showing a structure when the semiconductor device to which gold wires are connected according to any of the above embodiments is mounted on a wiring substrate and encapsulated with a resin.

In a mounting method using wire bonding, a metal wire 76 is connected by bonding as shown in FIG. 8E. After that, as shown in FIG. 13, a semiconductor chip 402 is placed on a wiring substrate 401 and encapsulated with a molding resin 405. Solder balls 404 are formed in the form of an array on the surface away from the mounting surface of the wiring substrate 401.

Figure 14:
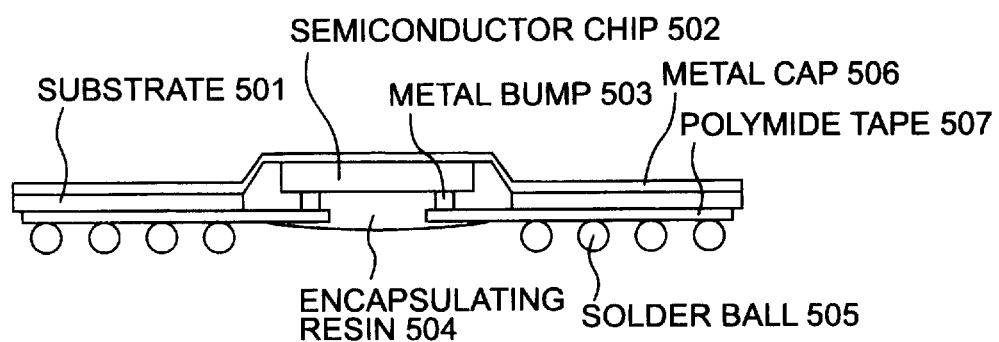
FIG. 14 is a longitudinal sectional view showing a structure when TAB mounting is performed for a semiconductor chip having copper pads.

In a TAB mounting method, as shown in FIG. 14, gold bumps 503 are formed on pads of a semiconductor chip 502. This semiconductor chip 502 is placed on a metal cap 506. With a resin substrate 501 interposed between them, lines are formed and a polyimide tape 507 having solder balls 505 is connected.

The aforementioned embodiments are merely examples and hence do not restrict the present invention. For example, although a barrier metal is formed by titanium/nickel/palladium films, this barrier metal can also be formed using another material. Also, in each of the above embodiments, a copper diffusion preventing film is formed on a copper pad connected to a copper line, and a barrier metal is formed on this copper diffusion preventing film. However, similar effects can be obtained when a copper diffusion preventing film is formed on a silver pad connected to a silver line and a barrier metal is formed on this copper diffusion preventing film.

What is claimed is:

1. A semiconductor device in which a semiconductor element having a copper pad is mounted on a wiring substrate, comprising:

copper diffusion preventing film formed on the surface of said copper pad to prevent diffusion of copper;

a metal film formed on the surface of said copper diffusion preventing film to improve adhesion between said copper diffusion preventing film and a metal wire; and said metal wire electrically connected to said copper pad with said copper diffusion preventing film and said metal film interposed therebetween, wherein said semiconductor element is mounted on said wiring substrate and connected to said metal wire, and said copper diffusion preventing film contains at least one of Ni, Cr, TiN, TaN, Ta, Nb, and WN, and said metal film contains one of Au and Pd.

2. A semiconductor device in which a semiconductor element having a copper pad is mounted on a wiring substrate, comprising:

a copper diffusion preventing film formed directly on at least a part of the surface of said copper pad to prevent diffusion of copper such that the copper diffusion preventing film is in direct contact with the at least a part of the surface of the copper pad; and a metal bump electrically connected to said copper pad with said copper diffusion preventing film interposed therebetween, wherein said semiconductor element is mounted on said wiring substrate via said metal bump, said metal bump contains gold, and one of a stacked film of Ti, Ni, and Pd, a stacked film of Ti, Ni, and Au, a stacked film of TiW and Au, and a stacked film of TiW and Pd is formed between said copper diffusion preventing film and said metal bump.

3. A device according to claim 2, wherein said copper diffusion preventing film contains at least one of Ni, Cr, TiN, TaN, Ta, Nb, and WN.

4. A semiconductor device in which a semiconductor element having a copper pad is mounted on a wiring substrate, comprising:

a passivation film formed on the copper pad and having an opening to expose the surface of the copper pad;

a copper diffusion preventing film formed directly on a part of the surface of said copper pad via the opening of the passivation film and formed on the entire inner surface of the opening to prevent diffusion of copper such that the copper diffusion preventing film is in direct contact with the part of the surface of the copper pad; and a metal bump electrically connected to said copper pad with said copper diffusion preventing film interposed therebetween, wherein said semiconductor element is mounted on said wiring substrate via said metal bump, said metal bump contains solder, and one of a stacked film of Ti and Ni, a stacked film of Ti, Ni, and Pd, a stacked film of Ti, Ni, and Au, a stacked film of Cr and Ni, a stacked film of Cr and Au, a stacked film of Cr, Ni, and Au, a stacked film of Cr, Ni, and Pd, a stacked film of Ti and Cu, a stacked film of Ti, Cu, and Au, a stacked film of Cr and Cu, and a stacked film of Cr, Cu, and Au is formed between said copper diffusion preventing film and said metal bump.

5. A device according to claim 4, wherein said copper diffusion preventing film contains at least one of Ni, Cr, TiN, TaN, Ta, Nb, and WN.

6. A semiconductor device in which a semiconductor element having a copper pad is mounted on a wiring substrate, comprising:

a copper diffusion preventing film formed on the surface of said copper pad to prevent diffusion of copper;

a metal film formed on the surface of said copper diffusion preventing film to improve adhesion between said copper diffusion preventing film and a metal wire; and said metal wire electrically connected to said copper pad with said copper diffusion preventing film and said metal film interposed therebetween, wherein said semiconductor element is mounted on said wiring substrate and connected to said metal wire, and said copper diffusion preventing film contains at least one of Ni, Cr, TiN, TaN, Ta, Nb, and WN, and said metal film is one of an Au film and a Pd film.

* * * * *